(12) United States Patent
Tanaka et al.

(10) Patent No.: US 11,515,144 B2
(45) Date of Patent: Nov. 29, 2022

(54) IN-SITU FILM ANNEALING WITH SPATIAL ATOMIC LAYER DEPOSITION

(71) Applicant: Applied Materials, Inc., Santa Clara, CA (US)

(72) Inventors: Keiichi Tanaka, San Jose, CA (US); Andrew Short, San Jose, CA (US); Mandyam Sriram, San Jose, CA (US); Srinivas Gandikota, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 968 days.

(21) Appl. No.: 15/374,438

(22) Filed: Dec. 9, 2016

(65) Prior Publication Data

US 2017/0170009 A1    Jun. 15, 2017

Related U.S. Application Data

(60) Provisional application No. 62/265,982, filed on Dec. 10, 2015.

(51) Int. Cl.
*H01L 21/02* (2006.01)
*C23C 16/56* (2006.01)
*C23C 16/04* (2006.01)
*C23C 16/455* (2006.01)
(Continued)

(52) U.S. Cl.
CPC ...... *H01L 21/02164* (2013.01); *C23C 16/045* (2013.01); *C23C 16/45527* (2013.01); *C23C 16/50* (2013.01); *C23C 16/56* (2013.01); *H01L 21/0228* (2013.01); *H01L 21/0234* (2013.01); *H01L 21/02208* (2013.01); *H01L 21/02211* (2013.01); *H01L 21/02219* (2013.01); *H01L 21/02274* (2013.01); *H01L 21/02337* (2013.01); *H01L 21/76224* (2013.01)

(58) Field of Classification Search
CPC ......... H01L 21/02164; H01L 21/02337–0234; H01L 21/0228; H01L 21/3105; H01L 21/02318; C23C 16/402
See application file for complete search history.

(56) References Cited

U.S. PATENT DOCUMENTS 7,148,155 B1    12/2006  Tarafdar et al.
7,294,583 B1 *  11/2007  Rulkens ............ H01L 21/31612
                                                              438/778
(Continued)

FOREIGN PATENT DOCUMENTS

JP      2013055243 A     3/2013
KR  10-2007-0093914 A    9/2007
KR      20130133622 A    12/2013

OTHER PUBLICATIONS

PCT International Search Report and Written Opinion n PCT/US2016/065906 dated Mar. 20, 2017, 12 pages.
(Continued)

*Primary Examiner* — Shahed Ahmed
*Assistant Examiner* — Sun Mi Kim King
(74) *Attorney, Agent, or Firm* — Servilla Whitney LLC

(57) ABSTRACT

Methods for filling the gap of a semiconductor feature comprising exposure of a substrate surface to a precursor and reactant and an anneal environment to decrease the wet etch rate ratio of the deposited film and fill the gap.

7 Claims, 6 Drawing Sheets

(51) Int. Cl.
    *C23C 16/50*     (2006.01)
    *H01L 21/762*    (2006.01)

(56)  References Cited

U.S. PATENT DOCUMENTS

| | | | | |
|---|---|---|---|---|
| 7,625,603 | B2* | 12/2009 | Partridge | C23C 16/045 |
| | | | | 216/2 |
| 7,767,588 | B2 | 8/2010 | Luo et al. | |
| 7,858,535 | B2* | 12/2010 | Surthi | C23C 16/402 |
| | | | | 257/E21.241 |
| 2004/0058293 | A1 | 3/2004 | Nguyen et al. | |
| 2004/0248374 | A1 | 12/2004 | Belyansky et al. | |
| 2007/0020875 | A1 | 1/2007 | Hsu et al. | |
| 2007/0215036 | A1 | 9/2007 | Park et al. | |
| 2010/0190341 | A1* | 7/2010 | Park | C23C 16/045 |
| | | | | 438/694 |
| 2013/0059415 | A1 | 3/2013 | Kato et al. | |
| 2013/0337635 | A1* | 12/2013 | Yamawaku | H01L 21/02104 |
| | | | | 438/466 |
| 2015/0140786 | A1 | 5/2015 | Kwak | |

OTHER PUBLICATIONS

PCT International Preliminary Report on Patentability in PCT/US2016/065906 dated Jun. 21, 2018, 9 pages.

\* cited by examiner

IN-SITU FILM ANNEALING WITH SPATIAL ATOMIC LAYER DEPOSITION

CROSS-REFERENCE TO RELATED APPLICATIONS

This application claims priority to U.S. Provisional Application No. 62/265,982, filed Dec. 10, 2015, the entire disclosure of which is hereby incorporated by reference herein.

TECHNICAL FIELD

The present disclosure relates generally to methods of depositing thin films. In particular, the disclosure relates to processes for the deposition of films by spatial ALD with in-situ annealing.

BACKGROUND

In microelectronics device fabrication, there is a need to fill narrow trenches (ARs>10:1) with no voiding for many applications. One such application is shallow trench isolation (STI). In STI, the film needs to be of high quality throughout the trench (i.e., having a wet etch rate ratio less than about 2) with very low leakage.

One of possible solutions is Spatial Atomic Layer Deposition (ALD). Spatial ALD uses a sequence of atomic layer deposition and plasma etch which enables void free fill in trenches at reasonable productivity. Both thermal ALD and plasma enhanced (PE) ALD can be used to provide conformal void free deposition. However, although thermal ALD has uniform film quality in structure, average film quality is relatively poor that requires additional post processes such as steam anneal and UV-cures. On the other hand, PEALD can provide good film quality especially on the top part of surface feature but not throughout the filled trenches due to nature of plasma distribution. Thus, also requiring post processes. The additional post treatment processes add extra cost to overall device processes.

Therefore, there is a need in the art for processes to gap fill semiconductor features with defect free film.

SUMMARY

One or more embodiments of the disclosure are directed to processing methods comprising exposing a substrate surface having at least one feature thereon to a deposition environment to deposit a film. The substrate surface is exposed to an anneal environment to improve a property of the film.

Additional embodiments of the disclosure are directed to processing methods comprising positioning a substrate surface in a processing chamber. The substrate surface has at least one feature thereon. The at least one feature creates a gap with a bottom, top and sidewalls. The substrate surface is exposed to a deposition environment comprising at least one cycle of a silicon precursor and an oxygen containing reactant to form a silicon oxide film on the at least one feature. The substrate surface is exposed to an anneal environment to improve a wet etch rate ratio of the silicon oxide film. Exposure to the deposition environment and, optionally, the anneal environment, is repeated to fill the gap of the feature.

Further embodiments of the disclosure are directed to processing method comprising placing a substrate having a substrate surface with a feature into a processing chamber. The processing chamber comprises a plurality of process regions with each process region separated from adjacent process regions by a gas curtain. At least a portion of the substrate surface is exposed to a first process condition in a first process region of the processing chamber. The first process condition comprises a silicon precursor. The substrate surface is laterally moved through a gas curtain to a second process region of the processing chamber. The substrate surface is exposed to a second process condition in the second process region of the processing chamber. The second process condition comprises an oxygen-containing reactant to form a silicon oxide film. The substrate surface is laterally moved through a gas curtain to a third process region of the processing chamber. The substrate surface is exposed to a third process condition in the third process region of the processing chamber. The third process condition comprises an anneal environment. Exposure to the first process condition and the second process condition is repeated to fill the feature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
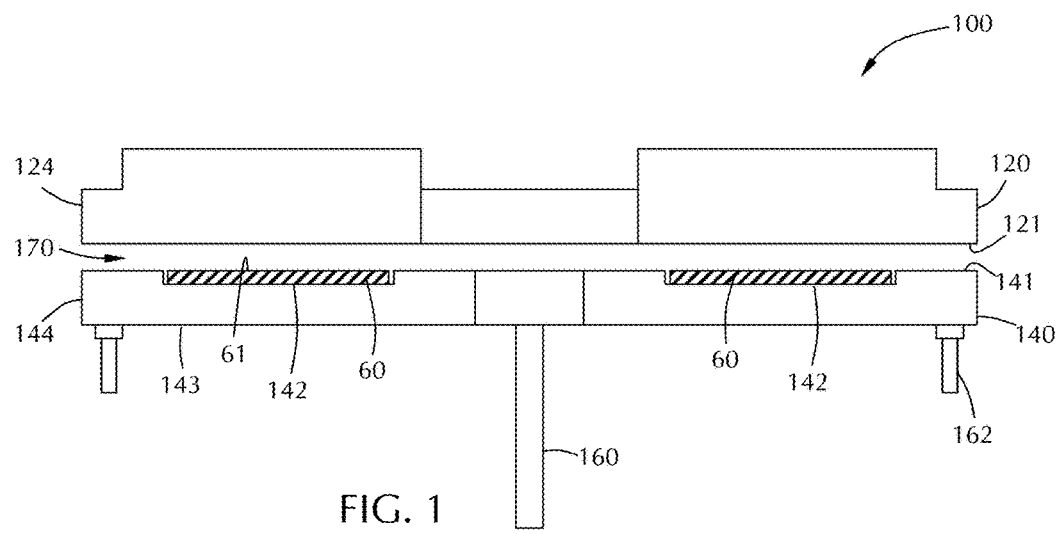
FIG. 1 shows a cross-sectional view of a batch processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Some embodiments of the disclosure are directed to processes that use a reaction chamber with multiple gas inlet channels that can be used for introduction of different chemicals or plasma gases. Spatially, these channels are separated by inert purging gases and/or vacuum pumping holes to create a gas curtain that minimizes or eliminates mixing of gases from different channels to avoid unwanted gas phase reactions. Wafers moving through these different spatially separated channels get sequential and multiple surface exposures to different chemical or plasma environment so that layer by layer film growth in spatial ALD mode or surface etching process occur. In some embodiments, the processing chamber has modular architectures on gas distribution components and each modular component has independent parameter control (e.g., RF or gas flow) to provide flexibility to control, for example, gas flow and/or RF exposure.

Some embodiments of the disclosure use spatial architectures and comprise a first chemistry dosing on a substrate surface followed by a second chemical exposure to react with the dosed chemistry to form a film, followed by a third additional post treatment process. In use, embodiments of the disclosure have an ALD layer that can be exposed to in-situ post treatment. In some embodiments, the treatment is done once. In some embodiments, the treatment may be employed every cycle. The minimum amount of treatment might be in the range of every 1 to 100 deposition cycles or more.

The film being deposited may determine what type of treatment is used. For instance, in the case of the ALD of $SiO_2$ using BDEAS and $O_2$ plasma, treatment may be performed by employing a steam anneal step using $H_2O$ plasma or thermally flowing the $H_2O$. The water can be delivered as a vapor to the injector by, for example, a bubbler or DLI (direct liquid injection). Controlled water vapor can then be flowed through the injector module which configures gas distribution function and in some cases with plasma capability.

Embodiments of the disclosure are directed to methods for filling the gap of a semiconductor feature. As used in this regard, a feature can be trench having a bottom and sidewalls. Gap filling deposits a film to fill the trench. The substrate is exposed to a precursor and reactant to deposit a film. The substrate is then moved to an anneal environment to change at least one of the film parameters. The methods of various embodiments allow for the formation of continuous and/or defect-free films with low wet etch rate ratios.

While the process of various embodiments is described with respect to the deposition of silicon oxide films, those skilled in the art will understand that the scope of the disclosure is not so limited. Embodiments of the disclosure can be used in the formation of other materials such as, but not limited to, metals and dielectrics. Some embodiments of the disclosure are used to form a film comprising one or more of $SiO_2$, TiN, $AlO_x$, SiN and/or $TiO_x$.

One or more embodiments of the disclosure are directed to processing methods comprising sequentially exposing a substrate surface to a precursor and a reactant to form a film, and an anneal environment to treat the film. In some embodiments, the precursor comprises a silicon precursor. In some embodiments, deposition can be achieved by maximizing the partial pressure of the silicon precursor while minimizing the wafer temperature. Suitable silicon precursors include, but are not limited to, bis(diethylamino)silane (BDEAS), tetrakis(dimethylamino)silane (TDMAS) and/or bis(tertiary-butylamino)silane (BTBAS).

The pressure in the processing chamber, or region of the processing chamber can be independently controlled for the precursor exposure, reactant exposure and anneal environment. In some embodiments, exposure to each of the precursor, reactant and the anneal environment occurs at a pressure in the range of about 50 mTorr to about 200 Torr, or about 50 mTorr to about 100 Torr. In some embodiments, the silicon precursor is exposed to the substrate at a pressure greater than or equal to about 500 mTorr, or greater than or equal to about 1 Torr, or greater than or equal to about 5 Torr, or greater than or equal to about 10 Torr, or greater than or equal to about 20 Torr, or greater than or equal to about 30 Torr.

The temperature at which the substrate surface is exposed to the precursor, reactant or anneal environment can be varied depending on, for example, the thermal budget of the device being formed and the precursor. In some embodiments, exposure to each of the precursor, reactant and the anneal environment occurs at a temperature in the range of about 350° C. to about 700° C. In one or more embodiments, the silicon halide precursor is exposed to the substrate at a temperature in the range of about 375° C. to about 600° C., or in the range of about 400° C. to about 550° C. In some embodiments, the deposition temperature is about the same as the anneal temperature. In one or more embodiments, the anneal temperature is maintained within ±25° C. of the deposition temperature.

Some embodiments of the disclosure are directed to gap fill processes using a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
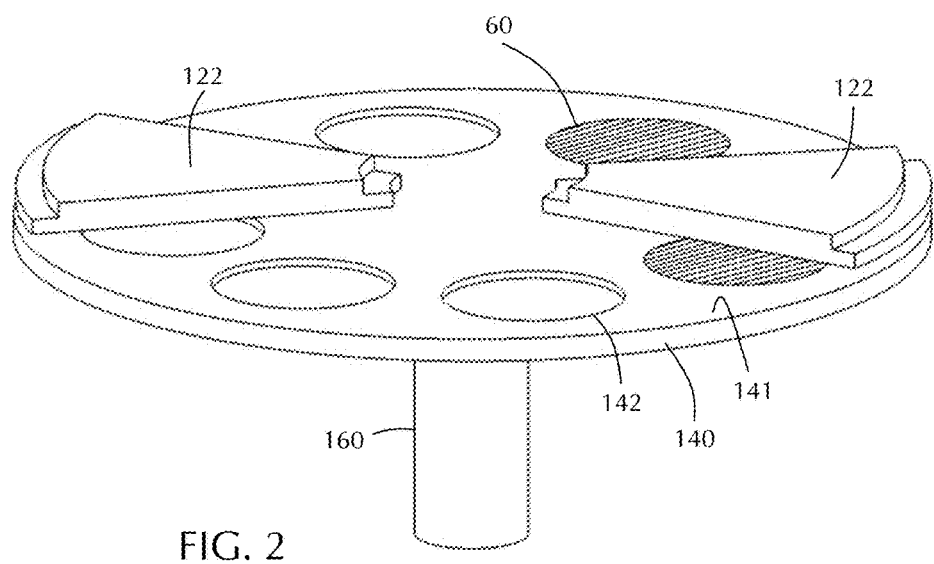
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
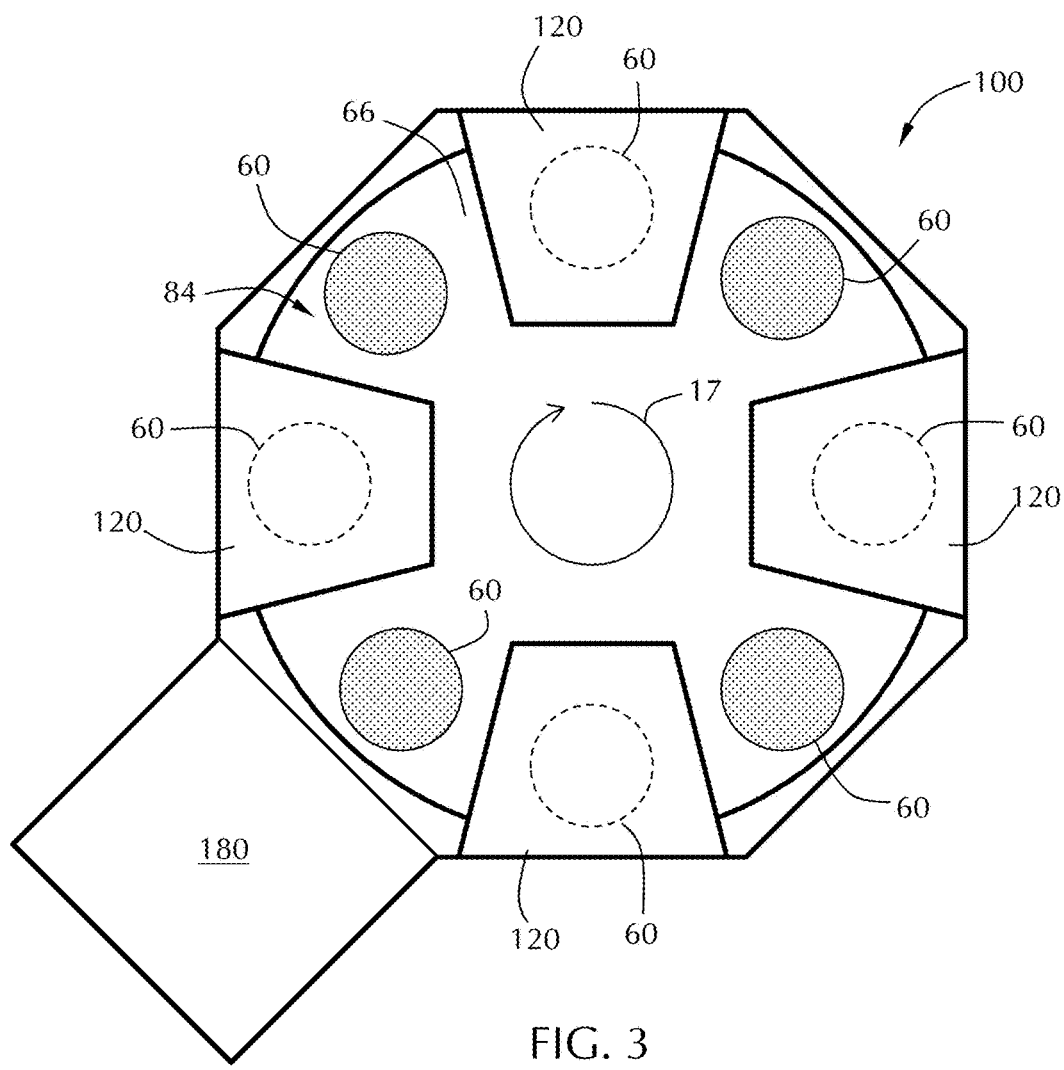
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between injector assemblies 120 to be moved to an injector assembly 120 for film deposition, as illustrated by the dotted circle under the injector assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
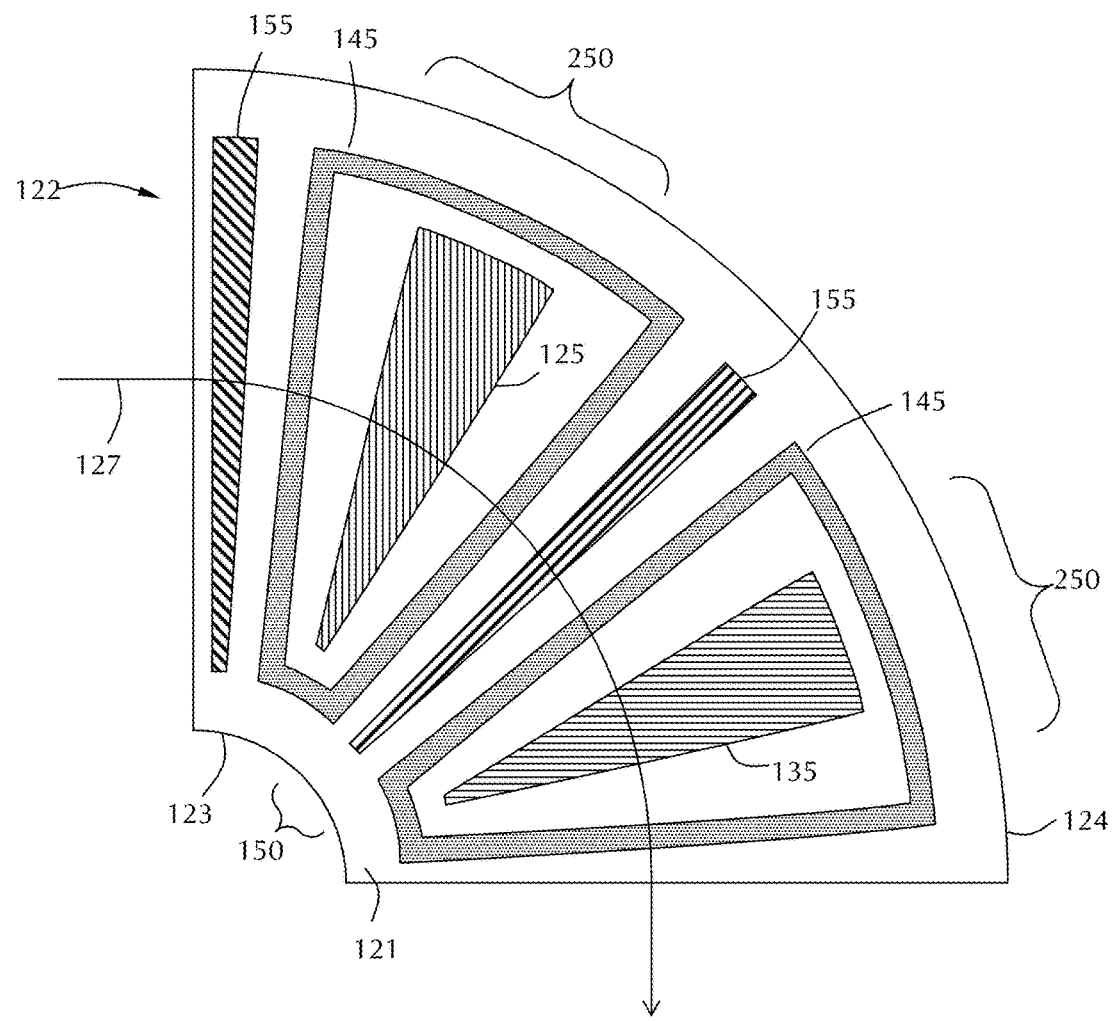
FIG. 4 shows a schematic view of a portion of a wedge shaped gas distribution assembly for use in a batch processing chamber in accordance with one or more embodiment of the disclosure.
Figure 5:
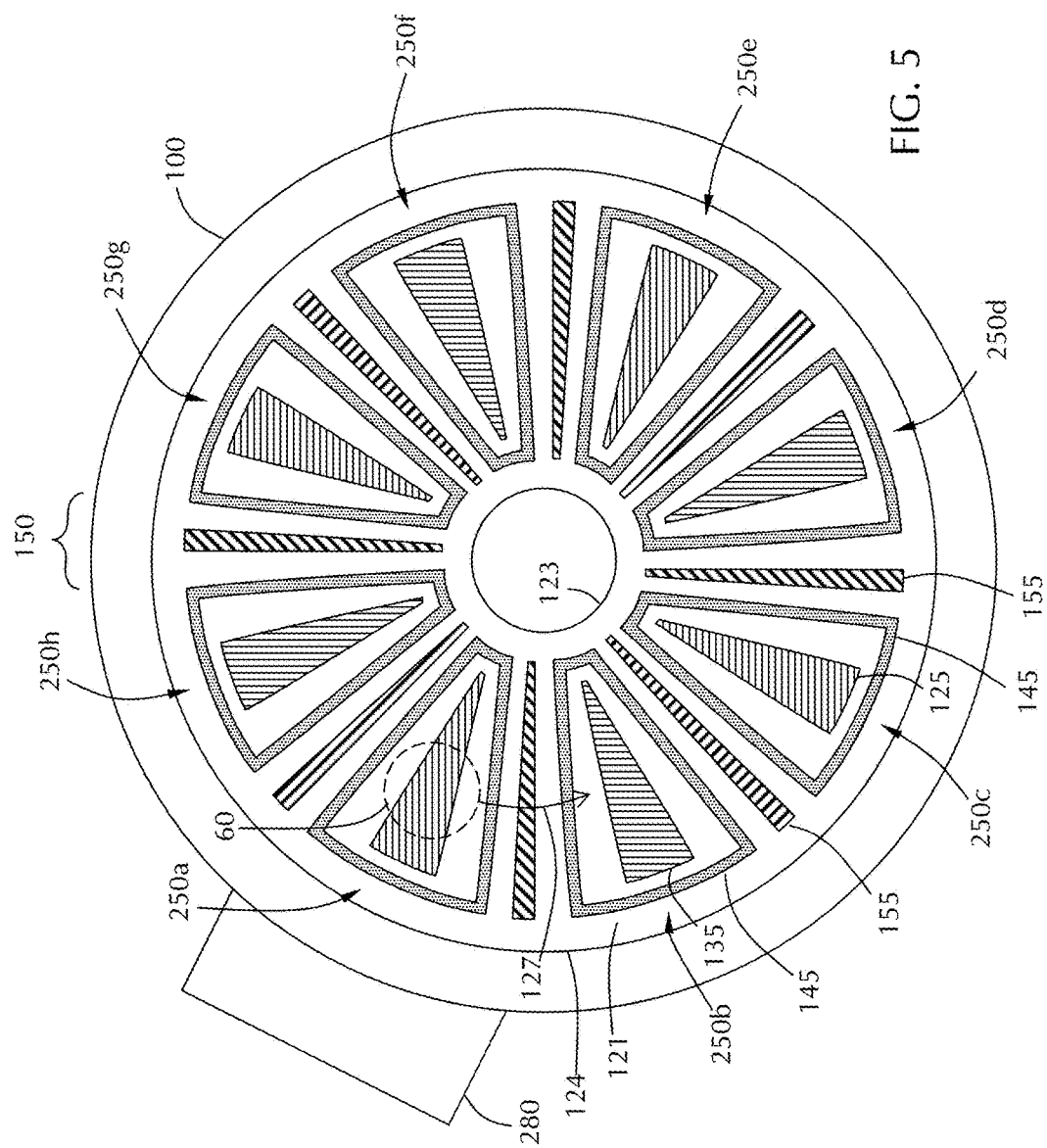
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145, 155 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas 125 and the second reactive gas 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process region. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution plate 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first process region 250a through the eighth process region 250h, including all process regions between.

Embodiments of the disclosure are directed to processing methods comprising a processing chamber 100 with a plurality of process regions 250a-250h with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250a-250h. The number of gas curtains is generally equal to or greater than the number of process regions.

A plurality of substrates 60 are positioned on a substrate support, for example, the susceptor assembly 140 shown FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

A first reactive gas A is flowed into one or more of the process regions 250 while an inert gas is flowed into any process region 250 which does not have a first reactive gas A flowing into it. For example if the first reactive gas is flowing into process regions 250*b* through process region 250*h*, an inert gas would be flowing into process region 250*a*. The inert gas can be flowed through the first reactive gas port 125 or the second gas port 135.

The inert gas flow within the process regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the process regions easier by decreasing the differences in pressure between adjacent regions.

Accordingly, one or more embodiments of the disclosure are directed to processing methods utilizing a batch processing chamber like that shown in FIG. 5. A substrate 60 is placed into the processing chamber which has a plurality of sections 250, each section separated from adjacent section by a gas curtain 150.

Figure 7:
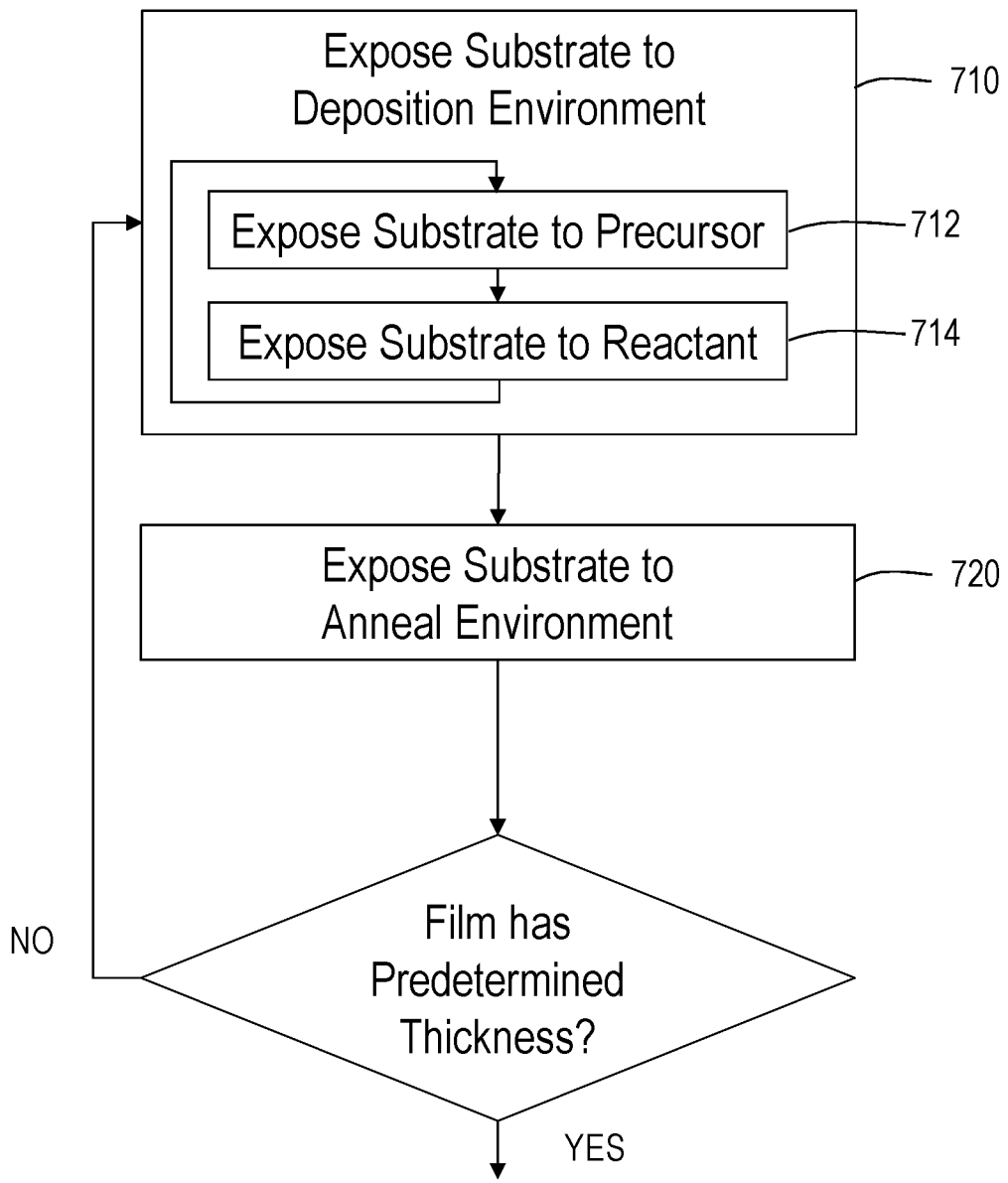
FIG. 7 shows a processing method in accordance with one or more embodiment of the disclosure.

Referring to FIG. 7, some embodiments of the method 700 comprise exposing a substrate surface having a feature thereon to a deposition environment 710 to deposit a film. As used in this regard, a "deposition environment" comprises one or more process regions or process conditions that deposit a film.

At least a portion of the substrate surface is exposed to a first process condition in a first section 250*a* of the processing chamber. The first process condition of some embodiments comprises a silicon precursor to form a silicon layer.

The substrate surface is laterally moved through a gas curtain 150 to a second section 250*b*. The silicon layer is exposed to a second process condition in the second section 250*b*. The second process condition of some embodiments comprises a reactant that can react with the substrate surface. In some embodiments, the reactant comprises an oxygen-containing reactant to form an oxide film. Suitable oxygen-containing reactants include, but are not limited to, water, peroxide, carbon dioxide, molecular oxygen and ozone. In some embodiments, the second process condition comprises a nitrogen-containing compound, for example, molecular nitrogen, ammonia or hydrazine to form a nitride film.

The substrate surface is laterally moved from the second process region to another process region that may have the first process condition or an annealing environment. As each sequential exposure to the first process condition and the second process condition deposits a layer of film, repeated exposure might deposit multiple layers of the film.

The deposition environment of some embodiments comprises the first process condition at 712 and the second process condition at 714 in separate process regions of the processing chamber. Stated differently, the deposition environment of some embodiments comprises the first process region and the second process region including any gas curtains adjacent either or both process regions. In some embodiments, depositing the film comprises repeating the exposure of the substrate surface to the deposition environment at 710 to fill the feature. Exposing the substrate surface to the deposition environment at 710 includes laterally moving the substrate surface from the first process region having the first process condition at 712 to a second process region having the second process condition at 714. In some embodiments, exposure to the deposition environment at 710 includes lateral movement of the substrate surface through a gas curtain between the first process region and the second process region.

After a predetermined number of deposition cycles, the substrate surface is laterally moved to a process region that has an annealing environment at 720. An annealing environment is any conditions (e.g., gas, temperature, pressure) that can improve a property of the deposited film. For example, the annealing environment may improve the wet etch rate of the deposited film. In some embodiments, the anneal environment comprises steam (water vapor). In some embodiments, other gases can be used in the anneal environment. Suitable gases include, but are not limited to, $H_2O_2$, $CO_2$, $O_2$, $O_3$ and/or $H_2$. In some embodiments, the anneal environment comprises a plasma in which an annealing gas is flowed into. Suitable plasmas include, but are not limited to, Ar, $O_2$, $O_3$ and/or $N_2$. The plasma can be, for example, a direct plasma or remote plasma source and can be, for example, capacitively coupled or inductively coupled.

The time that the substrate surface is exposed to the anneal environment can be varied. Varying the time may be done by changing the movement speed of the substrate or increasing the size of the anneal environment. In some embodiments, the substrate surface is exposed to the anneal environment for a time in the range of about 30 seconds to about 10 minutes, or about 1 minute to about 8 minutes, or for a time greater than 60 seconds, 90 seconds or 120 seconds.

After annealing at 720, the substrate surface can be exposed to additional first process conditions at 712 and second process conditions at 714 to form a film with a predetermined film thickness.

In some embodiments, the substrate surface is repeatedly exposed to the precursor in one section of the processing chamber, the reactant in one section of the processing chamber and an annealing environment in another section of the processing chamber. In an embodiment of this sort, the first process region 250*a* and fifth process region 250*e* may have the first process condition while the second process region 250*b* and sixth process region 250*f* has the second process condition and the third process region 250*c* and seventh process region 250*g* have an annealing environment. Those skilled in the art will understand that the use of ordinals such as "first" and "second" to describe process regions do not imply a specific location within the processing chamber, or order of exposure within the processing chamber. For example, the substrate may be exposed to the annealing environment first followed by the first process condition in the second process region.

In some embodiments, the annealing environment is in more than one process region for each first process condition and second process condition. For example, the first process region 250*a* may have the first process condition, the second process region 250*b* may have the second process condition and the third process region 250*c* and fourth process region 250*d* may have an annealing environment. In embodiments of this sort, the gas curtain between the third process region 250*c* and the fourth process region 250*d* may be disabled.

The thickness of the film formed with the precursor and reactant prior to exposure to the anneal environment can be modified. In some embodiments, the substrate surface is exposed to the annealing environment after formation of a film having a thickness in the range of about 10 Å to about 300 Å, or about 20 Å to about 250 Å, or up to about 400 Å, or 350 Å, or 300 Å, or 250 Å, or 200 Å, or 150 Å or 100 Å. In some embodiments, the substrate surface is exposed to the annealing environment after a number of cycles of precursor/reactant exposure, the number in the range of 1 to about 200 cycles, or about 1 to about 100 cycles.

In some embodiments, the anneal environment is disabled so that only an inert gas flows into the process region. This can be done to allow for repeated exposure to the precursor and reactant to grow a film. Once the film of predetermined thickness has been deposited, the anneal environment can be turned on and the substrate passed through. In some embodiments, once a film of predetermined thickness has been deposited, the precursor/reactant flows are stopped while the anneal environment is created that the substrate can be exposed to longer annealing.

Sample A

Figure 6A:
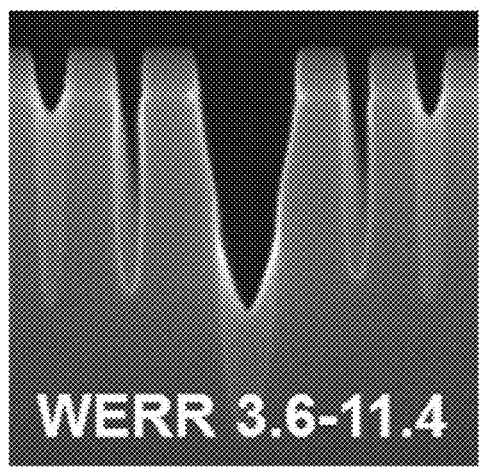
FIGS. 6A and 6B show SEM images of Samples A and B, respectively.

A silicon oxide film was deposited onto a substrate surface having a trench. After deposition of about 200-300 Å of $SiO_2$, the wet etch rate in trench was measured using 1% HF. The wet etch rate ratio (WER), measured relative to a thermal oxide was calculated to be 3.6-11.4 at tighter trenches. FIG. 6A shows a SEM image of Sample A.

Sample B

Figure 6B:
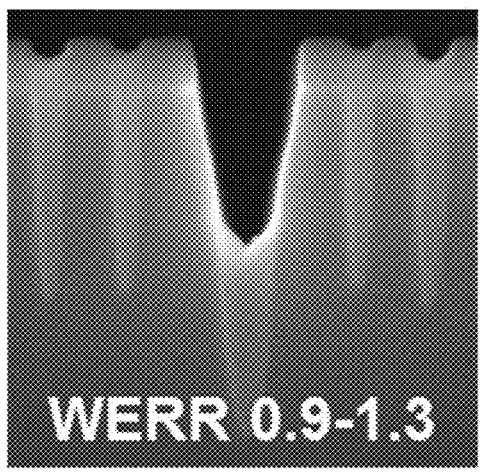

An $SiO_2$ film was deposited as in Sample A. The film was subjected to an annealing environment comprising water vapor at that same temperature as deposition of the film. The wet etch rate was measured using 1% HF. The wet etch rate ratio, relative to thermal oxide was calculated to be 0.9-1.3 at tighter trenches. FIG. 6B shows a SEM image of Sample B.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
    exposing a substrate surface in a first process region to a first process condition comprising a precursor, the substrate surface having a feature thereon;
    laterally moving the substrate surface from the first process region to a second process region;
    exposing the substrate surface in the second process region to a second process condition comprising a reactant, the first process region and the second process region comprising a deposition environment to deposit a film and maintained at a deposition temperature in the range of 400° C. to 550° C.;
    laterally moving the substrate surface from the second process region to an anneal region;
    exposing the substrate surface in the anneal region to a thermal anneal environment to improve a property of the film, the anneal environment comprising water vapor and maintained at an anneal temperature ±25° C. of the deposition temperature; and
    repeating the exposure to the deposition environment and the anneal environment to fill the feature,
wherein the deposition environment and the anneal environment are within the same processing chamber, each of the first process region, the second process region and the anneal region surrounded by vacuum ports and separated by purge gas ports.

2. The method of claim 1, wherein the substrate surface is exposed to the anneal environment after in the range of 1 to 200 exposures to the deposition environment.

3. The method of claim 1, wherein the substrate surface is exposed to the anneal environment after repeated exposure to the deposition environment forms a film having a thickness in the range of 10 Å to 300 Å.

4. The method of claim 1, wherein the improving the property of the film comprises lowering the wet etch rate ratio.

5. The method of claim 1, wherein the first process condition comprises a silicon precursor, the second process condition comprises an oxygen-containing reactant and the film is $SiO_2$.

6. The method of claim 5, wherein the anneal environment improves the wet etch rate ratio of the film.

7. The method of claim 6, wherein the wet etch rate ratio is decreased to in the range of 0.8 to 1.5.

* * * * *